United States Patent
Lee et al.

(10) Patent No.: US 8,432,199 B2
(45) Date of Patent: Apr. 30, 2013

(54) FRACTIONAL DIGITAL PLL WITH ANALOG PHASE ERROR COMPENSATOR

(75) Inventors: Ja Yol Lee, Daejeon (KR); Seong-Do Kim, Daejeon (KR); Hyun Kyu Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/310,581

(22) Filed: Dec. 2, 2011

(65) Prior Publication Data

US 2012/0161832 A1 Jun. 28, 2012

(30) Foreign Application Priority Data

Dec. 23, 2010 (KR) ........................ 10-2010-0134101

(51) Int. Cl.
*H03L 7/06* (2006.01)
(52) U.S. Cl.
USPC ........................................... 327/156; 327/147
(58) Field of Classification Search .................. 327/147, 327/156
See application file for complete search history.

(56) References Cited

U.S. PATENT DOCUMENTS

| | | | |
|---|---|---|---|
| 5,834,987 A * | 11/1998 | Dent | 332/127 |
| 6,580,376 B2 * | 6/2003 | Perrott | 341/61 |
| 6,809,598 B1 * | 10/2004 | Staszewski et al. | 331/16 |
| 6,829,318 B2 * | 12/2004 | Kawahara | 375/376 |
| 2003/0099173 A1 * | 5/2003 | Park | 369/47.28 |
| 2003/0141936 A1 | 7/2003 | Staszewski et al. | |
| 2009/0097609 A1 * | 4/2009 | Chang et al. | 375/376 |
| 2011/0193601 A1 * | 8/2011 | Albasini et al. | 327/156 |
| 2012/0161832 A1 * | 6/2012 | Lee et al. | 327/156 |

OTHER PUBLICATIONS

Ping-Ying Wang et al., "A Digital Intensive Fractional-N PLL and All-Digital Self-Calibration Schemes", IEEE Journal of Solid-State Circuits, Aug. 2009, pp. 2182-2192, vol. 44, No. 8, IEEE.

* cited by examiner

*Primary Examiner* — Adam Houston

(57) ABSTRACT

Disclosed is a fractional digital phase locked loop with an analog phase error compensator. The digital phase locked loop with an analog phase error compensator can reduce excessive power consumption and power noise and transient current noise while increasing phase error detection resolution by performing fractional phase error detection and compensation through the analog phase error compensator.

5 Claims, 3 Drawing Sheets

FRACTIONAL DIGITAL PLL WITH ANALOG PHASE ERROR COMPENSATOR

CROSS-REFERENCES TO RELATED APPLICATIONS

The present application claims priority under 35 U.S.C. 119(a) to Korean Application No. 10-2010-0134101, filed on Dec. 23, 2010, in the Korean Intellectual Property Office, which is incorporated herein by reference in its entirety set forth in full.

BACKGROUND

Exemplary embodiments of the present invention relate to a fractional digital phase locked loop (PLL) with an analog phase error compensator, and more particularly, to a fractional digital phase locked loop with an analog phase error compensator capable of reducing excessive power consumption and power noise and transient current noise while increasing phase error detection resolution by performing fractional phase error detection and compensation through the analog phase error compensator.

Recently, a charge pump or a phase locked loop (hereinafter, referred to as PLL) have been mainly used to implement an RF frequency synthesizer for multiband mobile communication. However, analog circuit design technologies are integrated in the charge pump PLL and therefore, a separately additional analog RF library is required in addition to a design library that is provided during a standard digital CMOS process due to analog circuits and analog signal characteristics, such that the charge pump PLL is hard to be integrated with a digital baseband signal processing block using a digital CMOS process.

In addition, a nano digital CMOS process has been developed with the recent development of a process technology. As a result, the digital baseband signal processing block has been quickly developed by the nano digital CMOS process.

Since a digital circuit needs not to be redesigned so as to keep pace with development trends of nano technologies, the digital circuit may be easily adapted to manufacturing process technologies. However, an analog RF circuit needs to be redesigned each time process technologies are changed and an operating voltage thereof may also be small since a CMOS process technology is developed to a nanoscale.

Thereby, much time and cost are consumed so as to improve several problems at the time of the analog RF circuit design during the nano digital CMOS process. Accordingly, research and development for digital RF that gradually converts the analog RF circuit block into a digital type is being actively conducted.

In particular, the frequency synthesizer in an RF transceiver is a part that may be formed into an all digital type. The digital PLL frequency synthesizer is a long-established technology but has poor phase noise and jitter characteristics and thus, is not almost used as a local oscillator of the RF transceiver for mobile communication requiring high-quality phase noise.

In recent, however, a new type of an all digital PLL (hereinafter, referred to as ADPLL) has been developed by applying the digital PLL technology to the frequency synthesizer for mobile communication. In the related art, only a difference between the digital PLL and the ADPLL is a digitally controlled oscillator (hereinafter, referred to as DCO). There is a difference in that the related DCO is implemented as a digital logic but the recent DCO is implemented as an LC resonator.

Therefore, the LC resonance DCO has more excellent characteristics in the phase noise or the jitter noise than the DCO using the digital logic of the related art.

The LC resonance DCO adjusts an oscillation frequency by controlling fractional variations of capacitance of the LC resonator. Therefore, a capacitor bank is divided into a coarse adjustment bank and a fine adjustment bank. Therefore, the coarse adjustment bank of the DCO is used at the time of fixing a PPL lock so as to approach the desired PLL frequency and is handed over to a fine adjustment bank by a mode conversion signal at the time of approaching the targeted PLL frequency by the coarse adjustment bank, wherein the fine adjustment bank applies a lock to the targeted PLL frequency through fractional tracking.

The fractional phase error (e) used for the fractional tracking is generated by a time-to-digital converter (hereinafter, referred to as TDC) and a fractional phase difference between a reference clock and a DCO clock that is an output value of a digital controlled oscillator is compensated in an arithmetic phase detector according to the fractional phase error (e).

The phase noise performance of the digital PLL according to the related art is determined by the resolution of the fractional phase error (e) that can be detected by the TDC. That is, the higher the fractional phase error detection resolution of the TDC, the better the phase noise becomes. The fractional phase error detection resolution is determined by minimum delay time of a delay device such as an inverter chain. Further, the inverter chain of the TDC is operated using the DCO clock having a high frequency, such that large power consumption and noise may occur.

Therefore, the digital TDC basically has a limitation in the tolerable phase error detection resolution due to the delay time of the delay device, which is a main factor determining the phase noise in a loop band of the PLL. In addition, quantization error, nonlinearity, meta-stability, or the like, of the TDC make the phase locked loop non-linear, thereby causing fractional spurs.

The fractional spurs may be removed by an analog filter by the charge pump PLL of the related art, but may not be completely filtered by a loop filter of the digital PLL due to a truncation error of the digital filter.

In addition, the TDC is basically configured of the inverter chain, such that the TDC may be easily affected by power noise and induces large transient current. Therefore, the TDC additionally requires a power pin to which a large capacitor is attached.

The above technology configuration is a background art for helping understanding of the present invention but does not mean the related art well-known in the art to which the present invention pertains.

SUMMARY

An object of the present invention is to provide a fractional digital locked loop with an analog phase error compensator capable of reducing transient power consumption and power noise and transient current noise while increasing phase error detection resolution by performing fractional phase error detection and compensation through an analog phase error compensator.

An embodiment of the present invention relates to a fractional digital phase locked loop with an analog phase error compensator, including: an arithmetic phase error detector configured to detect digital phase error values by accumulating a frequency command word and a DCO clock and sampling the accumulated values of the frequency command word and the DCO clock synchronized and accumulated with rising edges of a reference clock by a retimed clock; an analog phase error compensator configured to detect and compensate fractional phase error values of the reference clock and the DCO clock according to a fractional phase difference between the reference clock and the retimed clock; a digital loop gain controller configured to filter the digital phase error values and to control loop operation characteristics; a digital controlled oscillator configured to vary a frequency of the DCO clock according to an output value of the digital loop gain controller and the fractional phase error values compensated by the analog phase error compensator; and a retimed clock generator configured to synchronize the reference clock with the rising edges of the DCO clock to output the retimed clock.

In one embodiment, the arithmetic phase error detector may include: a reference accumulator accumulating the frequency command word according to the retimed clock; a high-speed accumulator accumulating a phase of the DCO clock; a sampler sampling the output value of the high-speed accumulator according to the retimed clock to detect phase variations of the DCO clock; and a subtractor detecting the digital phase error values through a difference between the frequency command word accumulated in the reference accumulator and the phase variation of the DCO clock detected in the sampler.

In one embodiment, the retimed clock generator may be a latch circuit receiving the reference clock to output the retimed clock while being synchronized with the rising edges of the DCO clock.

In one embodiment, the analog phase error compensator may include: a pulse width generator converting a phase difference between the reference clock and the retimed clock into a pulse width; and a pulse width voltage converter converting the pulse width of the pulse width generator into variable voltage.

In one embodiment, the pulse width voltage converter may include: a current generator generating current in proportion to the pulse width; and an impedance block converting current generated from the current generator into voltage.

As set forth above, the embodiments of the present invention can reduce the transient power consumption and the power noise and the transient current noise while increasing the phase error detection resolution by performing the fractional phase error detection and compensation through the analog phase error compensator mounted in the digital phase locked loop.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Figure 1:
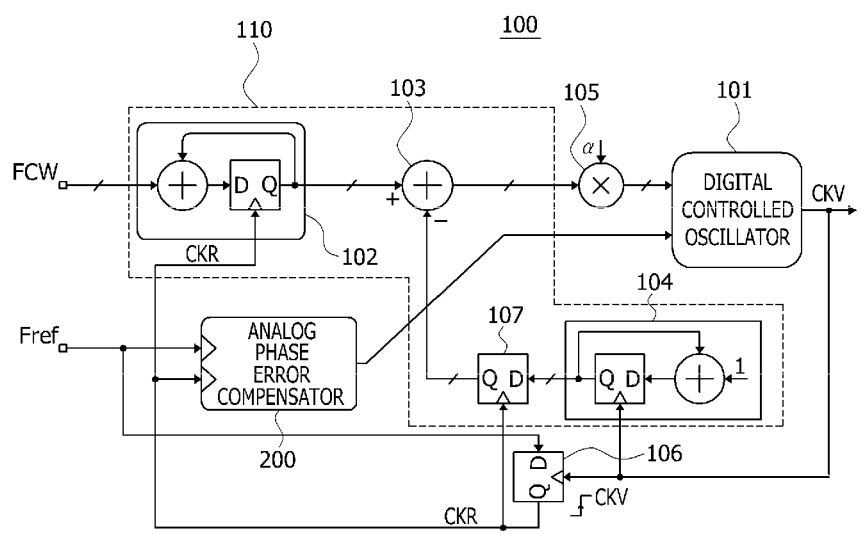
FIG. 1 is a block configuration diagram showing a fractional digital phase locked loop according to an embodiment of the present invention.

Hereinafter, embodiments of the present invention will be described with reference to accompanying drawings. However, the embodiments are for illustrative purposes only and are not intended to limit the scope of the invention.

In describing the embodiment, a thickness of lines illustrated in the drawings, a size of components, etc., may be exaggeratedly illustrated for clearness and convenience of explanation. In addition, terms described to be below are terms defined in consideration of functions in the present invention, which may be changed according to the intention or practice of a user or an operator. Therefore, these terms will be defined based on contents throughout the specification.

Figure 2:
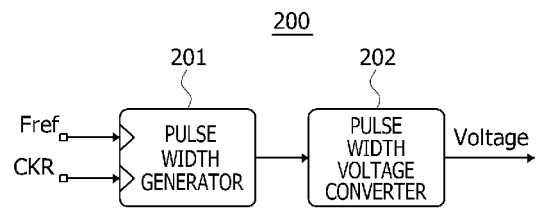
FIG. 2 is a block configuration diagram showing an analog phase error compensator of the fractional digital phase locked loop according to the embodiment of the present invention.
Figure 3:
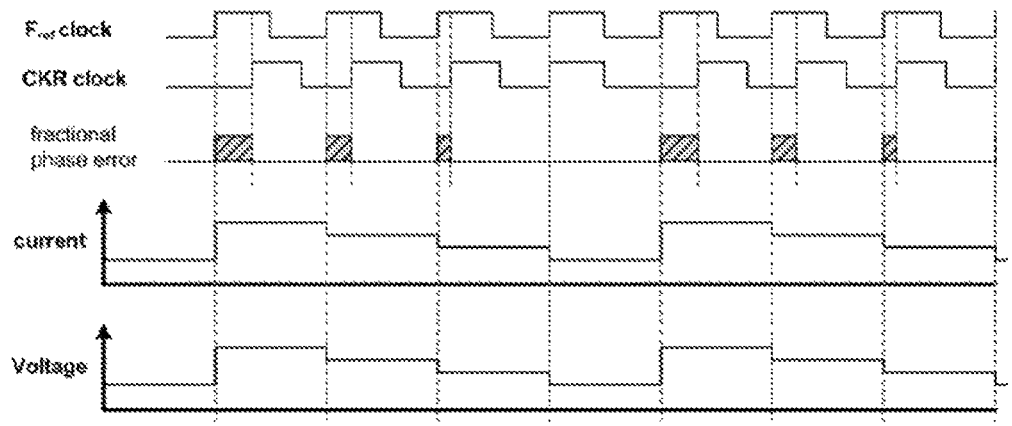
FIG. 3 is a diagram explaining a compensation operation of the analog phase error compensator of the fractional digital phase locked loop according to the embodiment of the present invention.

FIG. 1 is a block configuration diagram showing a fractional digital phase locked loop according to an embodiment of the present invention, FIG. 2 is a block configuration diagram showing an analog phase error compensator of the fractional digital phase locked loop according to the embodiment of the present invention, and FIG. 3 is a diagram explaining a compensation operation of the analog phase error compensator of the fractional digital phase locked loop according to the embodiment of the present invention.

As shown in FIG. 1, a fractional digital phase locked loop 100 according to an embodiment of the present invention includes an arithmetic phase error detector 110, an analog phase error compensator 200, a digital loop gain controller 105, a digital controlled oscillator 101, and a retimed clock generator 106.

The arithmetic phase error detector 110 includes a reference accumulator 102 that accumulates a frequency command word (FCW) according to a retimed clock CKR, a high-speed accumulator 104 that accumulates a phase of a DCO clock CKV, a sampler 107 that samples an output value from the high-speed accumulator 104 according to the retimed clock CKR to detect phase variations of the DCO clock CKV, and a subtractor 103 that detects digital phase error values through a difference between the frequency command word (FCW) accumulated in the reference accumulator 102 and the phase variations of the DCO clock CKV detected in the sampler 107.

Therefore, the arithmetic phase error detector 110 detects the digital phase error values by accumulating the frequency command word (FCW) and the DCO clock CKV and sampling the accumulated value of the frequency command word (FCW) and the DCO clock CKV synchronized and accumulated with rising edges of the DCO clock CKV by the retimed clock CKR.

The analog phase error compensator 200 detects and compensates fractional phase error values between a reference clock Fref and the DCO clock CKV according to a fractional phase difference between the reference clock Fref and the retimed clock CKR.

The analog phase error compensator 200 includes a pulse width generator 201 that converts a phase difference between the reference clock Fref and the retimed clock CKR into a pulse width and a pulse width voltage converter 202 that converts the pulse width of the pulse width generator 201 into variable voltage.

In this configuration, the pulse width voltage converter 202 may be configured to include a current generator (not shown) that generates current in proportion to the pulse width and an impedance block (not shown) that converts current generated from the current generator into voltage.

Therefore, when generating the pulse width from the pulse width generator 201 according to a magnitude in the phase error by detecting a time difference between edges of the reference clock Fref and the DCO clock CKV, that is, a phase error, a pulse width voltage converter receives pulses having different pulse widths according to the phase error and converts the received pulses into current and then, converts and outputs the current into voltage through an impedance block.

The compensation operation of the above-mentioned analog phase error compensator 200 will be described below with reference to FIG. 3.

Voltage or current corresponding to the fractional phase error may fractionally adjust a frequency of the digital controlled oscillator 101 by controlling capacitance or bias current of the digital controlled oscillator 101. That is, the frequency of the fractionally adjusted digital controlled oscillator 101 causes fractional phase variations of the DCO clock CKV to match rising edges of the DCO clock CKV with rising edges of the reference clock Fref, thereby offsetting the fractional phase error.

Therefore, the phase noise of the fractional digital phase locked loop is reduced due to the offset fractional phase error.

The digital loop gain controller 105 filters the digital phase error values detected in the subtractor 103 and controls loop operation characteristics.

The digital controlled oscillator 101 varies the frequency of the DCO clock CKV according to the output value of the digital loop gain controller 105 and the fractional phase error values compensated by the analog phase error compensator 200.

The retimed clock generator 106 may be configured of a latch circuit that synchronizes the reference clock Fref with the rising edges of the DCO clock CKV to output the retimed clock CKR. The output retimed clock CKR is used as a clock that synchronizes a signal flow in the fractional digital phase locked loop.

Figure 4:
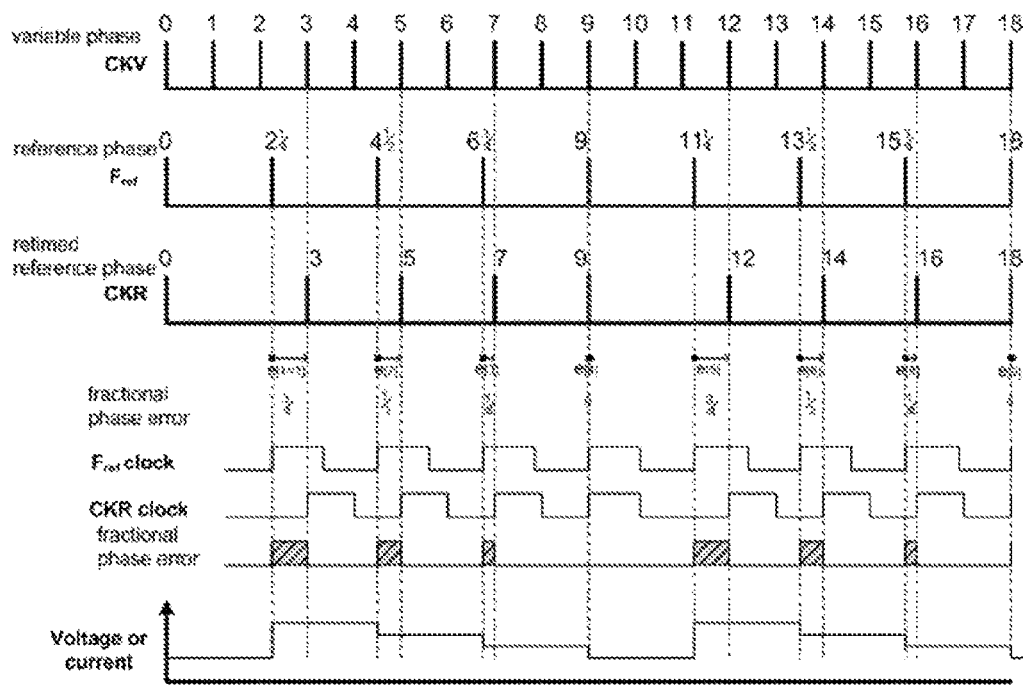
FIG. 4 is a diagram explaining a principle of compensating a fractional phase error of the fractional digital phase locked loop according to the embodiment of the present invention.
Figure 5:
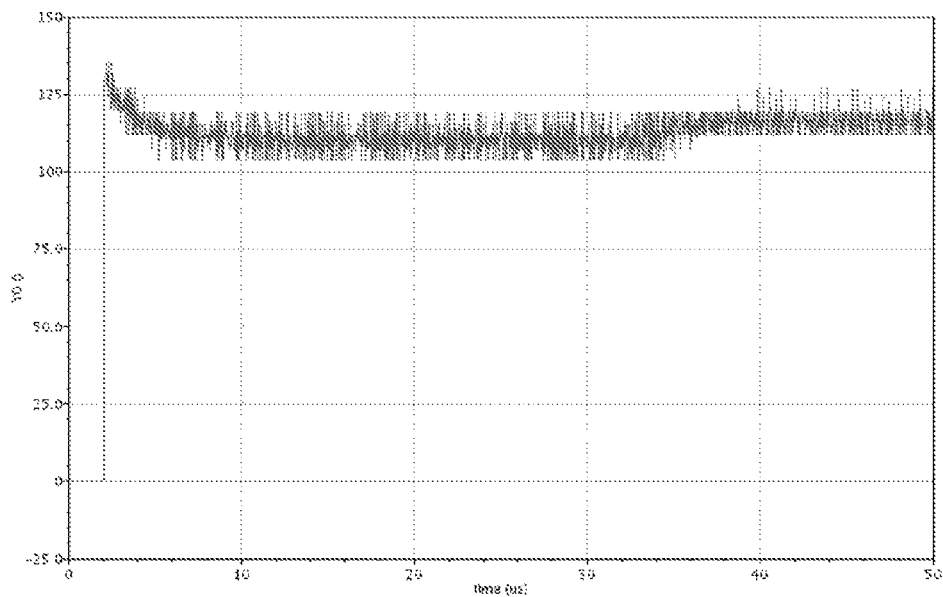
FIG. 5 is a diagram showing frequency fixing characteristics of the fractional digital phase locked loop according to the embodiment of the present invention.
Figure 6:
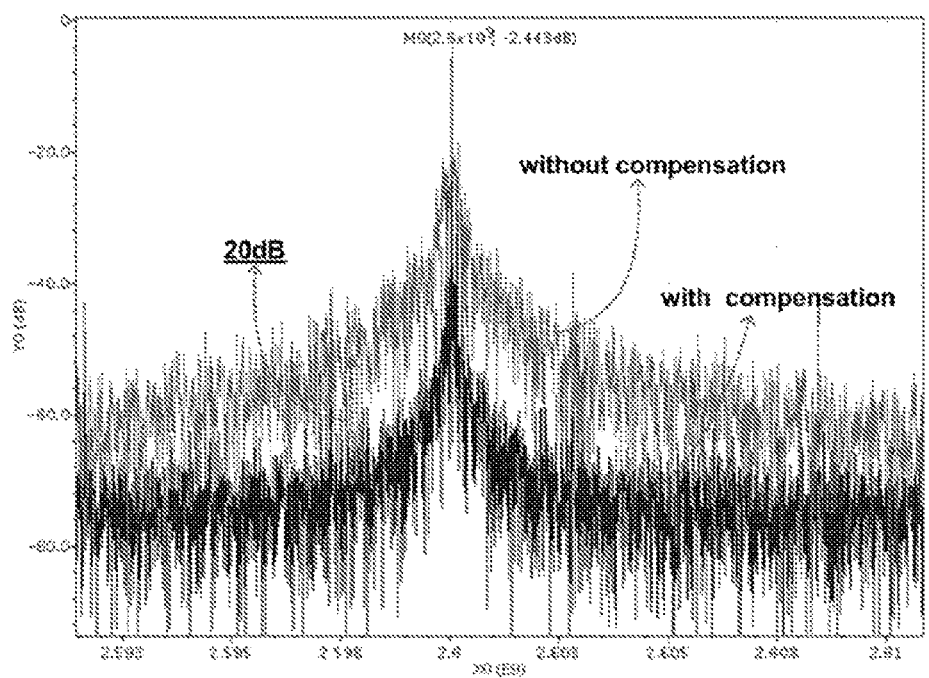
FIG. 6 is a diagram showing a locked output frequency spectrum of the fractional digital phase locked loop according to the embodiment of the present invention.

FIG. 4 is a diagram explaining a principle of compensating a fractional phase error of the fractional digital phase locked loop according to the embodiment of the present invention, FIG. 5 is a diagram showing frequency fixing characteristics of the fractional digital phase locked loop according to the embodiment of the present invention, and FIG. 6 is a diagram showing a locked output frequency spectrum of the fractional digital phase locked loop according to the embodiment of the present invention.

The operation of the fractional digital phase locked loop configured as described above will be described below with reference to drawings describing a principle of compensating the fractional phase error of the fractional digital phase locked loop according to the embodiment of the present invention shown in FIG. 4.

The high-speed accumulator 104 accumulating the phase of the DCO clock CKV that is the output of the digital controlled oscillator 101 counts and accumulates the number of rising edges of the DCO clock CKV. That is, values counting the rising edges of the DCO clock CKV are accumulated over time and the accumulated values are sampled at the rising edges of the retimed clock CKR by the sampler 107 and are input to the subtractor 103.

Similarly, the frequency command word (FCW) is accumulated by the reference accumulator 102 while being matched with the rising edges of the retimed clock CKR and is transferred to an input of the subtractor 103.

Then, the subtractor 103 performs subtraction on the accumulated value of the reference accumulator 102 and the sampled value of the high-speed accumulator 104 to detect the digital phase error.

The digital phase error controls the frequency of the digital controlled oscillator 101 through the digital loop gain controller 105 and control values controlling the digital controlled oscillator 101 are instantly different but become a predetermined constant value when the control values are averaged over a long period of time, such that a fixed frequency corresponding to a real multiple of the reference clock Fref is generated.

For example, when the value of the reference accumulator 102 is 6.75 (=6+¾) and the value of the high-speed accumulator 104 sampled by the retimed clock CKR is 7, the digital phase error calculated by the subtractor 103 becomes "−0.25". An amount corresponding to the digital phase error values, that is, −0.25 is shown by an oblique block as shown in FIG. 4. The above-mentioned digital phase error corresponds to a time phase error or an analog phase error between the rising edges between the reference clock Fref and the retimed clock CKR. Therefore, the digital phase error may be compensated using timing phase errors between the reference clock Fref and the retimed clock CKR.

In addition, the analog phase error compensator 200 receives the reference clock Fref and the retimed clock CKR as an input to detect the pulse type of the fractional phase error. In this case, the fractional phase error is converted into voltage or current and is then output.

The fractional phase error converted into the voltage or current controls the capacitance or bias current of the digital controlled oscillator 101 to convert the frequency of the digital controlled oscillator by and the frequency change is converted into the phase change to compensate the fractional phase error.

For example, in the case of a varactor adjustment LC tank digital controlled oscillator, the voltage corresponding to the fractional phase error adjusts the capacitance of the varactor to fractionally adjust the oscillation frequency of the digital controlled oscillator, thereby fractionally controlling the phase of the DCO clock CKV.

Therefore, the rising edges of the DCO clock CKV are matched or synchronized with the rising edges of the reference clock Fref so as to offset the fractional phase error, thereby reducing the phase noise.

In addition, even in the case of the current control digital controlled oscillator 101, the current corresponding to the fractional phase error controls the bias current of the digital controlled oscillator 101 to fractionally adjust the oscillation frequency of the digital controlled oscillator 101 and thus, the fractionally adjusted frequency adjusts the phase of the DCO clock CKV, thereby offsetting the fractional phase errors.

In the case of the fractional digital phase locked loop according to the embodiment of the present invention configured as described above, as shown in FIG. 5, the locking may start at about 5 μsec and when observing an output spectrum locked at 2.6 GHz shown in FIG. 6, it can be appreciated that the phase noise of about 20 dB is reduced when the analog phase error compensator is mounted as in the embodiment of the present invention.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A fractional digital phase locked loop with an analog phase error compensator, comprising:
   an arithmetic phase error detector configured to detect digital phase error values by accumulating a frequency command word and a DCO clock and sampling the accumulated values of the frequency command word and the DCO clock synchronized and accumulated with rising edges of a reference clock by a retimed clock;
   an analog phase error compensator configured to detect and compensate fractional phase error values of the reference clock and the DCO clock according to a fractional phase difference between the reference clock and the retimed clock;
   a digital loop gain controller configured to filter the digital phase error values and to control loop operation characteristics;
   a digital controlled oscillator configured to vary a frequency of the DCO clock according to an output value of the digital loop gain controller and the fractional phase error values compensated by the analog phase error compensator; and
   a retimed clock generator configured to synchronize the reference clock with the rising edges of the DCO clock to output the retimed clock.

2. The fractional digital phase locked loop with an analog phase error compensator of claim 1, wherein the arithmetic phase error detector includes:
   a reference accumulator configured to accumulate the frequency command word according to the retimed clock;
   a high-speed accumulator configured to accumulate a phase of the DCO clock;
   a sampler configured to sample the output value of the high-speed accumulator according to the retimed clock to detect phase variations of the DCO clock; and
   a subtractor configured to detect the digital phase error values through a difference between the frequency command word accumulated in the reference accumulator and the phase variation of the DCO clock detected in the sampler.

3. The fractional digital phase locked loop with an analog phase error compensator of claim 1, wherein the retimed clock generator includes a latch circuit receiving the reference clock to output the retimed clock while being synchronized with the rising edges of the DCO clock.

4. The fractional digital phase locked loop with an analog phase error compensator of claim 1, wherein the analog phase error compensator includes:
   a pulse width generator configured to convert a phase difference between the reference clock and the retimed clock into a pulse width; and
   a pulse width voltage converter configured to convert the pulse width of the pulse width generator into variable voltage.

5. The fractional digital phase locked loop with an analog phase error compensator of claim 4, wherein the pulse width voltage converter includes:
   a current generator configured to generate current in proportion to the pulse width; and
   an impedance block configured to convert current generated from the current generator into voltage.

* * * * *